(12) United States Patent
Roitsch et al.

(10) Patent No.: US 11,245,269 B2
(45) Date of Patent: Feb. 8, 2022

(54) METHOD FOR OBTAINING INFORMATION FOR OPERATING AN ACCUMULATOR, METHOD FOR OBTAINING PERIODS OF TIME FOR CHARGING DIFFERENT ACCUMULATORS, AND ELECTRIC GARDENING AND/OR FORESTRY APPARATUS SYSTEM

(71) Applicant: Andreas Stihl AG & Co. KG, Waiblingen (DE)

(72) Inventors: Tommy Roitsch, Waiblingen (DE); Simon Trinkle, Kaisersbach (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 237 days.

(21) Appl. No.: 16/003,787

(22) Filed: Jun. 8, 2018

(65) Prior Publication Data

US 2018/0358822 A1  Dec. 13, 2018

(30) Foreign Application Priority Data

Jun. 9, 2017 (EP) .................... 17175383

(51) Int. Cl.
| | |
|---|---|
| *H02J 7/00* | (2006.01) |
| *A01G 20/43* | (2018.01) |
| *H01M 10/48* | (2006.01) |
| *A01G 3/053* | (2006.01) |
| *H01M 10/44* | (2006.01) |
| *B25F 5/02* | (2006.01) |
| *G01R 31/36* | (2020.01) |
| *H02J 3/00* | (2006.01) |

(52) U.S. Cl.
CPC ............ *H02J 7/0021* (2013.01); *A01G 3/053* (2013.01); *A01G 20/43* (2018.02); *B25F 5/02* (2013.01); *H01M 10/441* (2013.01); *H01M 10/48* (2013.01); *H02J 7/0047* (2013.01); *G01R 31/3647* (2019.01); *H01M 2220/30* (2013.01); *H02J 3/003* (2020.01); *H02J 7/0048* (2020.01)

(58) Field of Classification Search
CPC ...................................... H02J 7/0021
USPC ......................................... 307/18
See application file for complete search history.

(56) References Cited

U.S. PATENT DOCUMENTS

| | | | |
|---|---|---|---|
| 2011/0197389 A1 | 8/2011 | Ota et al. | |
| 2011/0241616 A1* | 10/2011 | Kim | H02J 7/00 320/108 |
| 2016/0165795 A1 | 6/2016 | Balutis et al. | |
| 2017/0357270 A1* | 12/2017 | Russell | G05D 1/0257 |
| 2018/0029516 A1* | 2/2018 | Chelian | B60P 1/5404 |

FOREIGN PATENT DOCUMENTS

| | | |
|---|---|---|
| EP | 2 082 638 A1 | 7/2009 |
| EP | 2 294 960 A2 | 3/2011 |
| EP | 2 273 336 B1 | 10/2013 |

* cited by examiner

*Primary Examiner* — Daniel Cavallari
*Assistant Examiner* — Dru Parries
(74) *Attorney, Agent, or Firm* — Crowell & Moring LLP

(57) ABSTRACT

A method is provided for obtaining information for operating an accumulator, and for obtaining periods of time for charging different accumulators using the method. An electrical gardening and/or forestry apparatus system with at least one accumulator for carrying out such a method is provided.

15 Claims, 1 Drawing Sheet

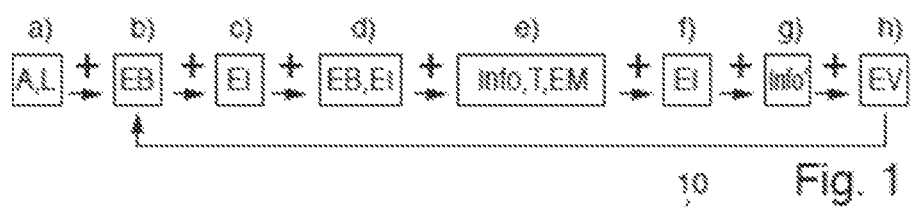
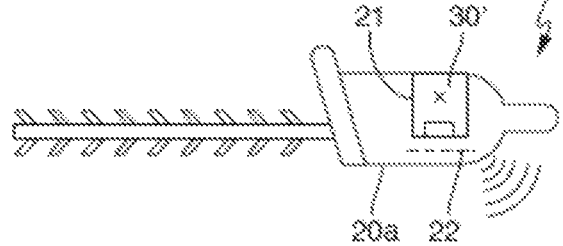
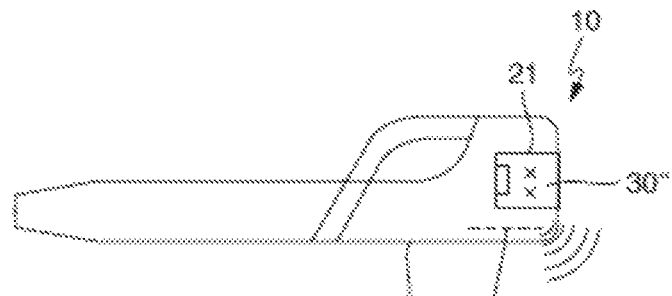
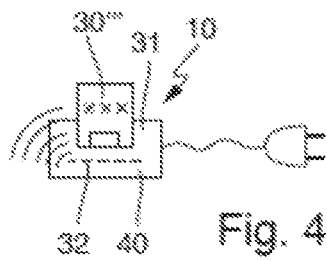
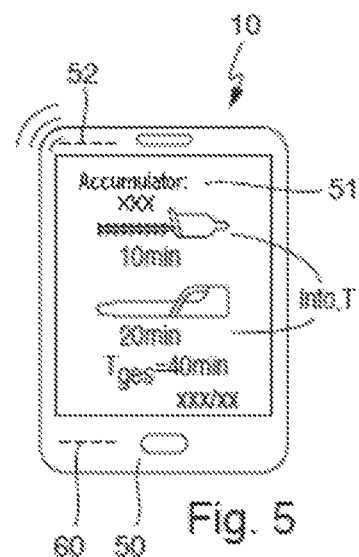
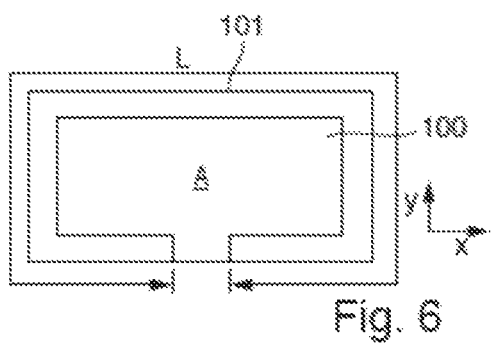

METHOD FOR OBTAINING INFORMATION FOR OPERATING AN ACCUMULATOR, METHOD FOR OBTAINING PERIODS OF TIME FOR CHARGING DIFFERENT ACCUMULATORS, AND ELECTRIC GARDENING AND/OR FORESTRY APPARATUS SYSTEM

CROSS REFERENCE TO RELATED APPLICATION

This application claims priority under 35 U.S.C. § 119 from European Patent Application No. 17 175 383.3, filed Jun. 9, 2017, the entire disclosure of which is herein expressly incorporated by reference.

BACKGROUND AND SUMMARY OF THE INVENTION

The invention relates to a method for obtaining information for operating an accumulator, a method for obtaining periods of time for charging different accumulators using such a method, and an electric gardening and/or forestry apparatus system with at least one accumulator for carrying out such a method.

A method for obtaining information for operating an accumulator and an electric gardening and/or forestry apparatus system with an accumulator are known.

The invention is based on the problem of making available a method for obtaining information for operating an accumulator which has improved properties, in particular more functionalities. Furthermore, the invention is based on the problem of making available a method for obtaining time periods for charging different accumulators using such a method, and an electric gardening and/or forestry apparatus system with at least one accumulator for carrying out such a method.

The invention solves this problem by providing methods and systems in accordance with claimed embodiments of the invention. Advantageous developments and/or refinements of the invention are described and claimed herein.

The method according to the invention is configured to obtain, in particular automatically, information for operating, in particular for charging, an accumulator. The accumulator is configured to supply, in particular electrical, drive energy to an electrically powered gardening and/or forestry apparatus. The method comprises the steps: a) obtaining or predefining an, in particular specific, employment of the electrically powered gardening and/or forestry apparatus, b) obtaining or determining an, in particular specific, energy demand of the gardening and/or forestry apparatus from the obtained employment, c) obtaining or determining an energy content of the accumulator, d) comparing the obtained energy demand to the obtained energy content, and e) obtaining or determining and outputting the, in particular specific, information for operating, in particular for charging, the accumulator based on the comparison.

The method can permit a user of the electrically powered gardening and/or forestry apparatus to make decisions, in particular specific decisions, with respect to the accumulator, the gardening and/or forestry apparatus and/or the employment.

A rechargeable accumulator for electrical energy on an electrochemical basis can be referred to as an accumulator. In particular, the step a) can comprise: selecting the employment from a stored number of employments. The energy content of the accumulator can be referred to as the residual energy or state of charge. It may be the case that in order to cover the energy demand of the gardening and/or forestry apparatus for the employment, the accumulator does not need to be completely charged and/or have been completely charged. It may be sufficient for the accumulator to be, in particular, in only a partially charged state and/or to be only partially charged. In particular, if the energy demand is equal to or less than the energy content, this can be output.

The step b) can be carried out simultaneously with the step a) or chronologically after it. The step c) can be carried out simultaneously with the steps/the step a) and/or b), or chronologically after or before the latter. The step d) can be carried out simultaneously with the steps/the step b) and/or c) or chronologically after the latter. The step e) can be carried out simultaneously with the step d) or chronologically after it.

In one development of the invention, the employment of the electrically powered gardening and/or forestry apparatus has a surface area, a length and/or a number of cuts of an object to be treated, in particular a specific object. This can permit relatively simple obtaining of the employment. The object can have a piece of ground, in particular a piece of unsealed ground, a green area, in particular a meadow, a lawn and/or a bed with flowers or other plants, a number of bushes or shrubs, a hedge and/or a number of trees. Additionally or alternatively, the employment can have an, in particular anticipated, apparatus running time.

In one refinement of the invention, the step a) comprises: moving, in particular moving automatically, or guiding a position determination device for determining position coordinates along the object to be treated; determining position coordinates using the position determination device during the movement; obtaining the surface area, the length and/or the number of cuts of the object to be treated based on the determined position coordinates. This can permit the employment to be obtained in a particularly simple way. In particular, the position determining device can have a satellite position determining receiver, a local positioning system device, an inertia position determination device and/or an odometry position determination device. Additionally or alternatively, position coordinates can be determined in another way. In particular, position coordinates can be determined and/or selected from a database, such as, for example, the Internet. It is also additionally or alternatively possible for at least one image of the object to be captured and/or at least one image which has been captured of the object to be selected, in particular by the user. The surface area, the length and/or the number of cuts can be determined based on the captured image. In particular, position coordinates can be determined based on the captured image. It is also additionally or alternatively possible for the surface area, the length and/or the number of cuts to be predefined, in particular by the user.

In one development of the invention, step e) comprises: obtaining or determining an, in particular specific, quantity of energy for charging the accumulator to meet the obtained energy demand, in particular if the energy demand is greater than the energy content, in particular based on the comparison; obtaining or determining and outputting the, in particular specific, information for operating, in particular for charging, the accumulator based on the obtained quantity of energy. The quantity of energy for charging the accumulator does not need to be equal to the difference between the energy content and the energy demand. The quantity of energy can be greater than the difference, in particular owing to a charging efficiency level which is less than or worse than 100 percent. The quantity of energy for charging the accumulator can be equal to zero, in particular if the energy demand is equal to or less than the energy content. In particular, when the information is obtained, an operating limit of the accumulator for the charging process and/or an operating limit of a charger or loader for charging the accumulator can be taken into account, in particular if the energy demand is greater than the energy content.

In one development of the invention, the information has a period of time for the charging of the accumulator. This can permit the user to detect how long he has to wait for the accumulator or for its charging. The period of time can be output with precision to the second, to the minute or in time periods, in particular in the form of at maximum 5 minutes, at minimum 5 minutes and/or at maximum 15 minutes, at minimum 15 minutes and/or at maximum 30 minutes, at minimum 30 minutes and/or at maximum 1 hour, at minimum 1 hour and/or at maximum 2 hours and at minimum 2 hours. The period of time for the charging of the accumulator can be equal to zero, in particular if the energy demand is equal to or less than the energy content. In particular, the period of time can be obtained from the quantity of energy, provided that it is obtained by taking into account charging of the accumulator. In particular, an operating limit of the accumulator for the charging and/or an operating limit of the charger, if present, can be taken into account in the charging of the accumulator. Various chargers such as a standard charger or a quick charger can take different amounts of time to charge the accumulator. The method can be referred to as a charging period time prediction.

In one development of the invention, in step e) the information is output using optics, acoustics and/or haptics. This can permit the user to perceive the information relatively well. In particular, the optical outputting can comprise displaying. The haptic outputting can comprise a vibration.

In one development of the invention, step c) comprises: measuring, in particular automatically measuring, an electric property of the accumulator and/or an electric property for charging the accumulator. In particular, the electric property or properties can comprise a voltage, in particular a quiescent voltage in the state of rest, and/or a current. The measurement can be carried out by means of the gardening and/or forestry apparatus and/or the charger for charging the accumulator, when present. In particular, the gardening and/or forestry apparatus can have the charger, or the charger can be integrated into the gardening and/or forestry apparatus. Additionally or alternatively, the measurement can be carried out using the accumulator itself or a measuring device which is permanently installed with the accumulator. It is also additionally or alternatively possible for the energy content of the accumulator to be obtained by obtaining a preceding apparatus running time and/or charging time since a previous complete charging of the accumulator and/or a capacity of the accumulator. In other words, the energy content can also be tracked during operation by means of Wh integration or Coulomb counting.

In one development of the invention, the method comprises the step: h) identifying, in particular automatically identifying, an energy consumption of the electrically powered gardening and/or forestry apparatus for the obtained employment, in particular during the employment. When the method is next carried out in step b), obtaining the, in particular next, energy demand of the gardening and/or forestry apparatus from the obtained, in particular next, employment based on the identified energy consumption, in particular for the preceding employment. This can permit relatively more precise, in particular user-specific and/or object-specific, obtaining of the energy demand, and therefore relatively more precise obtaining of the information. In particular, the energy consumption can be dependent on a method of working of the user of the gardening and/or forestry apparatus and/or on the object. The energy consumption can be obtained, like the energy content, by measuring and/or obtaining an apparatus running time, as described above. Additionally and/or alternatively, the employment can be identified. Before a first employment, the energy demand can be obtained based on a works-side basic value.

In one development of the invention, the method comprises the steps: f) charging the accumulator, and g) outputting further information if the energy content of the accumulator is sufficient to satisfy the energy demand. This can permit the user to perceive that he can start the employment. The step f) can be carried out simultaneously with the steps/step a), b), c), d) and/or e), or chronologically after or before said step or steps. The step g) can be carried out simultaneously with the steps/the step b), c), d), e) and/or f) or chronologically after said step or steps. In particular, during the charging the steps/the step c), d) and/or e) can be carried out or repeated, in particular multiple times.

In one development of the invention, the accumulator is configured to supply drive energy to different electrically powered gardening and/or forestry apparatuses. The method comprises the step: obtaining employments of the different electrically powered gardening and/or forestry apparatuses. Outputting information for operating, in particular for charging, the accumulator for the employments. This can permit the user to decide which employment he would like to carry out or with which gardening and/or forestry apparatus he would like to work and/or in which sequence he would like to carry out the employments. The gardening and/or forestry apparatuses can be suitable for the same employment and/or for the same object. In particular, the gardening and/or forestry apparatuses may be identical in design. The accumulator can be embodied as an exchangeable accumulator. The gardening and/or forestry apparatuses can each be configured for the exchangeable or detachable accommodation of the accumulator, in particular for destruction-free and/or tool-free accommodation.

Furthermore, the invention relates to a method for, in particular automatically, obtaining periods of time for charging different accumulators. The various accumulators are each configured to supply drive energy to the electrically powered gardening and/or forestry apparatus. The method according to the invention comprises the steps: obtaining a respective period of time for charging a respective accumulator according to the method described above, in particular in order to achieve the energy content in order to satisfy the energy demand for the employment of the electrically powered gardening and/or forestry apparatus. Comparing the periods of time of various accumulators. Obtaining the accumulator which has the shortest period of time for charging. Outputting the accumulator which has the shortest period of time for charging. This can permit the user to decide which accumulator he would like to use and/or which accumulator he would like to charge, in particular if only one charger is available. Alternatively, a plurality of chargers can be available. The various accumulators can be respectively compatible with individual chargers or a plurality of chargers, in particular can be charged using said chargers. It can be possible for one accumulator to have a shorter period of time than the other accumulator even though the quantity of energy to be charged for said one accumulator can be greater than that of the other accumulator. In particular, if the one accumulator can or may be charged with a higher power level than the other accumulator. In particular, the one accumulator may be compatible with a quick charger and the other accumulator can be compatible, in particular only compatible, with a standard charger. The periods of time can be obtained for various accumulator-charger pairs. The pair with the shortest period of time can be output. The accumulators can be identical in design. Additionally or alternatively, the various accumulators can have various maximum capacities. The accumulators can each be embodied as exchangeable accumulators. The gardening and/or forestry apparatus can be configured to accommodate, in particular at least, one of the accumulators in an exchangeable fashion. The shortest period of time can optionally be output.

In one development of the invention, the various accumulators are each configured to supply drive energy to various electrically powered gardening and/or forestry apparatuses. The method has the steps: obtaining employments of the various electrically powered gardening and/or forestry apparatuses. Obtaining a respective period of time for charging a respective accumulator for the employments. Obtaining total periods of time for charging the different accumulators for different accumulator-apparatus pairs based on the periods of time. Comparing the various total periods of time of the various accumulator-apparatus pairs. Obtaining the accumulator-apparatus pair which has the shortest total period of time for charging. Outputting the accumulator-apparatus pair which has the shortest total period of time for charging. This can make possible a situation in which the user or a plurality of users has/have to wait a relatively short time for the accumulators. In particular, the various accumulators can be assigned to the various gardening and/or forestry apparatuses for the various accumulator-apparatus pairs. A multiplicity of the accumulators can correspond to a multiplicity of the gardening and/or forestry apparatuses, and can be greater and/or less than said multiplicity. In particular, the total periods of time can be obtained by summing the periods of time. The shortest total period of time can optionally be output. Additionally or alternatively, the periods of time for the various accumulator-apparatus pairs can be compared, in particular simultaneously or chronologically after the periods of time have been obtained. The accumulator-apparatus pair which has the shortest period of time for charging can be obtained, and this accumulator-apparatus pair can be output. In other words, the accumulator-apparatus pair for which a maximum period of time is shortest can be obtained. The resulting total period of time does not need to be the shortest total period of time. It is also additionally or alternatively possible for the periods of time and/or the total periods of time for various accumulator-charger pairs to be obtained and said accumulator-charger pairs can be compared and/or output. These can be referred to as different accumulator-apparatus-charger pairs.

Furthermore, the invention relates to an electric gardening and/or forestry apparatus system. The electric gardening and/or forestry apparatus system according to the invention has the at least one electrically powered gardening and/or forestry apparatus and the at least one accumulator. The accumulator is configured to supply drive energy to the gardening and/or forestry apparatus. The electric gardening and/or forestry apparatus is configured to carry out the method described above. The gardening and/or forestry apparatus system can permit the same advantages as the method described above. In particular, the gardening and/or forestry apparatus can have an electric motor which can be configured to be supplied with drive energy by the accumulator. The gardening and/or forestry apparatus can be configured to carry out individual steps or all the steps of the method described above. Additionally or alternatively, the accumulator can be configured to carry out individual steps or all the steps of the method described above, in particular to obtain its energy content.

In one development of the invention, the electric gardening and/or forestry apparatus system has at least one charger. The charger is configured to charge the at least one accumulator. In particular, the charger can be configured to obtain the energy content of the accumulator and/or to obtain other steps of the method described above.

In one embodiment of the invention, the electric gardening and/or forestry apparatus system has a mobile or portable determination device or identification device. The mobile determination device is configured to obtain the employment of the at least one electrically powered gardening and/or forestry apparatus. Furthermore, the determination device is configured to obtain the energy demand of the gardening and/or forestry apparatus from the obtained employment. Moreover, the determination device is configured to compare the obtained energy demand with the obtained energy content of the at least one accumulator. Furthermore, the determination device is configured to obtain and output the information for operating, in particular for charging, the accumulator based on the comparison. This can permit the user to carry out the method easily. In particular, the determination device can be different from the gardening and/or forestry apparatus, the accumulator and/or the charger, if they are present. The determination device can have or be a smartphone and/or a tablet. In particular, the determination device can be configured to obtain the quantity of energy for charging the accumulator in order to achieve the energy demand. In addition, the determination device can be configured to obtain and output the information for operating, in particular for charging, the accumulator based on the obtained quantity of energy.

In one development of the invention, the at least one electrically powered gardening and/or forestry apparatus has a saw, a pole pruner, a clearing saw or a brush cutter, a hedge pruner or hedge shears, a hedge trimmer, a blower apparatus, a leaf blower, a lopper, a cutoff grinder, a sweeper apparatus, a sweeper roller, a sweeper brush, a lawn mower, a dethatcher and/or a grass trimmer.

Other objects, advantages and novel features of the present invention will become apparent from the following detailed description of one or more preferred embodiments when considered in conjunction with the accompanying drawings.

BRIEF DESCRIPTION OF THE DRAWINGS

FIG. 1 shows a flowchart of an exemplary method according to the invention.

FIG. 2 shows a schematic view of an electrically powered gardening and/or forestry apparatus and of an accumulator of an electric gardening and/or forestry apparatus system according to an embodiment of the invention.

FIG. 3 shows a schematic view of a further electrically powered gardening and/or forestry apparatus and of a further accumulator of the electric gardening and/or forestry apparatus system.

FIG. 4 shows a schematic view of a charger and of a further accumulator of the electric gardening and/or forestry apparatus system.

FIG. 5 shows a schematic view of a mobile determination device of the electric gardening and/or forestry apparatus system.

FIG. 6 shows a plan view of an object which is to be treated using the electric gardening and/or forestry apparatus system.

DETAILED DESCRIPTION OF THE DRAWINGS

FIG. 1 shows a method according to an embodiment of the invention for obtaining information Info for operating, in particular for charging, an accumulator 30', 30", 30''', as can be seen in FIGS. 2 to 4. The accumulator 30', 30", 30''' is configured to supply the electrical drive energy to an electrically powered gardening and/or forestry apparatus 20a, 20b. The method comprises the steps: a) obtaining an employment of the electrically powered gardening and/or forestry apparatus 20a, 20b. b) obtaining an energy demand EB of the gardening and/or forestry apparatus 20a, 20b from the obtained employment. c) obtaining an energy content EI of the accumulator 30', 30", 30'''. d) comparing the obtained energy demand EB with the obtained energy content EI. e) obtaining and outputting the information Info for operating, in particular for charging, the accumulator 30', 30", 30' based on the comparison.

The method therefore permits a user of the gardening and/or forestry apparatus 20a, 20b to make decisions relating to the accumulator 30', 30", 30''', the gardening and/or forestry apparatus 20a, 20b and/or the employment.

FIGS. 2 to 5 show an electric gardening and/or forestry apparatus system 10. The gardening and/or forestry apparatus system 10 has the at least one electrically powered gardening and/or forestry apparatus 20a, 20b. In the exemplary embodiment shown, the gardening and/or forestry apparatus system 10 has two gardening and/or forestry apparatuses 20a, 20b, as can be seen in FIGS. 2 and 3. In alternative exemplary embodiments, the gardening and/or forestry apparatus system can have just a single gardening and/or forestry apparatus or more than two gardening and/or forestry apparatuses. The gardening and/or forestry apparatus 20a shown in FIG. 2 has a hedge pruner or hedge shears or is a hedge pruner or hedge shears. The gardening and/or forestry apparatus 20b shown in FIG. 3 has a leaf blower or is a leaf blower. Furthermore, the gardening and/or forestry apparatus system 10 has the at least one accumulator 30', 30", 30'''. In the exemplary embodiment shown, the gardening and/or forestry apparatus system 10 has three accumulators 30', 30", 30'''. In alternative exemplary embodiments, the gardening and/or forestry apparatus system can have just a single accumulator, two accumulators or more than three accumulators. The various accumulators 30', 30", 30''' are each configured to supply drive energy to the at least one electrically powered gardening and/or forestry apparatus 20a, 20b. In particular, the accumulators 30', 30", 30' are identical in design. In detail, the accumulators 30', 30", 30' are each embodied as an exchangeable accumulator. The gardening and/or forestry apparatuses 20a, 20b are each configured to accommodate one of the accumulators 30', 30", 30''' in an exchangeable fashion. In other words: the gardening and/or forestry apparatuses 20a, 20b each have an accumulator shaft 21 for accommodating one of the accumulators 30', 30", 30". In alternative exemplary embodiments, the accumulator can be permanently installed in the gardening and/or forestry apparatus. In other words, the accumulator can be detached from the gardening and/or forestry apparatus, in particular only, using a tool. The electric gardening and/or forestry apparatus system 10 is configured to carry out the method described above.

Furthermore, the electric gardening and/or forestry apparatus system 10 has at least one charger 40. In the exemplary embodiment shown, the gardening and/or forestry apparatus system 10 has just a single charger 40. In alternative exemplary embodiments, the gardening and/or forestry apparatus system can have more than one charger. The charger 40 is configured to charge the at least one accumulator 30', 30", 30'''. In detail, the charger 40 is configured to accommodate one of the accumulators 30', 30", 30''' in an exchangeable fashion. In other words: the charger 40 has an accumulator shaft 31 for accommodating one of the accumulators 30', 30", 30'''.

In the exemplary embodiment shown, the at least one gardening and/or forestry apparatus 20a, 20b is configured to obtain the energy content EI of the accumulator 30', 30", 30''' which is accommodated or inserted therein. The charger 40 is configured to obtain the energy content EI of the accumulator 30''' which is accommodated or inserted therein. In alternative exemplary embodiments, it may be sufficient when either the gardening and/or forestry apparatus or the charger can be configured to obtain the energy content of the accumulator. It is also additionally or alternatively possible for the accumulator itself to be configured to obtain its energy content. In other words, the electric gardening and/or forestry apparatus system can have a measuring device, wherein the measuring device can be configured to obtain the energy content of the accumulator and can, in particular, be permanently installed with the accumulator.

Furthermore, the electric gardening and/or forestry apparatus system 10 has a mobile determination device 50, as can be seen in FIG. 5. The mobile determination device 50 is configured to obtain the employment of the at least one electrically powered gardening and/or forestry apparatus 20a, 20b. Furthermore, the determination device 50 is configured to obtain the energy demand EB of the gardening and/or forestry apparatus 20a, 20b from the obtained employment. Moreover, the determination device 50 is configured to compare the obtained energy demand EB with the obtained energy content EI of the at least one accumulator 30', 30", 30'''. Furthermore, the determination device 50 is configured to obtain and output the information Info for operating, in particular for charging, the accumulator 30', 30", 30''' based on the comparison. In the exemplary embodiment shown, the determination device 50 is a smartphone with a touchscreen 51.

In detail, the at least one gardening and/or forestry apparatus 20a, 20b has a device transmission unit, in particular in the form of an antenna. Furthermore, the charger 40 has a charge transmission unit 32, in particular in the form of an antenna. Moreover, the determination device 50 has a determination transmission unit 52, in particular in the form of an antenna. The device transmission unit 22 and the determination transmission unit 52 are configured to interact with one another and to transmit the obtained energy content EI of the accumulator 30', 30", 30''', in particular in a wireless fashion. The charge transmission unit 32 and the determination transmission unit 52 are configured to interact with one another and to transmit the obtained energy content EI of the accumulator 30', in particular in a wireless fashion. In alternative exemplary embodiments, the accumulator itself can have an accumulator transmission unit, in particular in the form of an antenna. The accumulator transmission unit and the determination transmission unit can be configured to interact with one another and to transmit the obtained energy content of the accumulator, in particular in a wireless fashion. Basically or generally, a respective transmission unit can have a radio interface.

In addition, the electric gardening and/or forestry apparatus system 10 has a position determination device 60 in the form of a satellite position determination receiver for determining position coordinates x, y along an object 100, 101 to be treated. In the exemplary embodiment shown, the determination device 50 has the position determination device 60, or the position determination device 60 is integrated into the determination device 50. In alternative exemplary embodiments, the position determination device does not need to be integrated into the determination device. In particular, the at least one gardening and/or forestry apparatus can have the position determination device.

In the exemplary embodiment shown, the employment of the gardening and/or forestry apparatus 20a which is shown in FIG. 2 in the form of the hedge pruner or hedge shears has an, in particular specific, length L of the object 101 in the form of a hedge, as can be seen in FIG. 6. The employment of the gardening and/or forestry apparatus 20b in the form of the leaf blower, as shown in FIG. 3, has an, in particular specific, surface area A of the object 100 in the form of a piece of ground with leaves.

In detail, step a) comprises: moving the position determination device 60 for determining position coordinates x, y along the, in particular at least one, object 100, 101 to be treated. Determining position coordinates x, y by means of the position determination device 60 during the movement. Obtaining the surface area A of the object 100 and the length L of the object 101 based on the determined position coordinates x, y. In the exemplary embodiment shown, the surface area A and the length L can be obtained together by moving the position determination device 60 along the object 101 in the form of the hedge. In particular, the method can comprise the step: storing the at least one obtained employment. In the exemplary embodiment shown, the determination device 50 has a memory unit (not illustrated) for storing the at least one obtained employment.

In the exemplary embodiment shown, step e) comprises: obtaining a quantity of energy EM for charging the accumulator 30', 30", 30''' to meet the obtained energy demand EB. Obtaining and outputting the information Info for operating, in particular for charging, the accumulator 30', 30", 30''' based on the obtained quantity of energy EM.

The determination device 50 is configured to obtain the quantity of energy EM for charging the accumulator 30', 30", 30''' to meet the energy demand EB. In addition, the determination device 50 is configured to obtain and output the information Info for operating, in particular for charging, the accumulator 30', 30", 30''' based on the obtained quantity of energy EM.

Furthermore, the information Info comprises a period of time T for charging the at least one accumulator 30', 30", 30'''.

In step e) the information Info or the period of time T is output or displayed using optics, in particular using the determination device 50 in the form of the smartphone with the touchscreen, as can be seen in FIG. 5.

In the exemplary embodiment shown, the method is carried out automatically. In particular, the carrying out can be triggered by means of the determination device 50. In step a), the employments of the various gardening and/or forestry apparatuses 20a, 20b are obtained, as described above. In step b), the energy demands EB for the various employments are obtained. In step c), the energy contents EI of the various accumulators 30', 30", 30''' are obtained. In detail, step c) comprises: measuring an electric property of each of the accumulators 30', 30", 30''' and/or an electric property for charging each of the accumulators 30', 30", 30'''.

In step d) the various energy demands EB are compared with the obtained energy contents EI, in particular for various accumulator-apparatus pairs. In step e) the information Info for operating a respective accumulator 30', 30", 30''', in particular in the form of respective periods of time T for charging such an accumulator 30', 30", 30''', is obtained based on the comparison, in particular for the various accumulator-apparatus pairs. In detail, step e) comprises: obtaining various quantities of energy EM for charging the various accumulators 30', 30", 30' to meet the obtained energy demands EB, in particular for the various accumulator-apparatus pairs. Obtaining the information Info for operating a respective accumulator 30', 30", 30''', in particular in the form of respective periods of time T for charging such an accumulator 30', 30", 30', based on the obtained quantities of energy EM, in particular for the various accumulator-apparatus pairs. Moreover, the respective periods of time T of the various accumulators 30', 30", 30' are compared. Furthermore, the accumulator 30', 30", 30' which has the shortest period of time T for charging is obtained and output. In addition, in step e) the information Info in the form of periods of time T for charging the accumulator 30', 30", 30''' with the shortest period of time T for the employments is output.

Each energy demand EB here is greater than each energy content EI. However, the energy content EI of the accumulator 30''' is the greatest. Furthermore, the energy demand EB of the gardening and/or forestry apparatus 20a in the form of the hedge pruner or hedge shears is the smallest. As a result, the period of time T for charging the accumulator 30''' for the employment of the gardening and/or forestry apparatus 20a is shortest, 10 minutes here. The accumulator 30''' is output in the form of a user-readable designation, for example of three crosses, and the information Info or the period of time T are output by means of the determination device 50. Furthermore, the information Info or the period of time T for charging the accumulator 30''' for the employment of the gardening and/or forestry apparatus 20b, twenty minutes here, is output. This permits the user to decide that he would firstly like to implement the employment of the gardening and/or forestry apparatus 20a in the form of the hedge pruner or hedge shears and he would like to charge the accumulator 30''' for this employment.

Furthermore, the method comprises the steps: f) charging the accumulator 30', 30", 30''', and g) outputting further information Info' if the energy content EI of the accumulator 30', 30", 30''' is sufficient to meet the energy demand EB. In the exemplary embodiment shown, the accumulator 30''' does not need to be charged completely for the employment of the gardening and/or forestry apparatus 20a in the form of the hedge pruner or hedge shears.

When the accumulator 30''' is sufficiently charged, it can be removed from the charger 40 and inserted into the gardening and/or forestry apparatus 20a instead of the accumulator 30'. The user can then start the employment, in particular he can cut the object 101 in the form of the hedge with the gardening and/or forestry apparatus 20a.

Furthermore, the method comprises the step: h) identifying an energy consumption EV of the electrically powered gardening and/or forestry apparatus 20a, 20b for the obtained employment, in particular during the employment. When the method is next carried out in step b) obtaining the next energy demand EB of the gardening and/or forestry apparatus 20a, 20b from the obtained, in particular next, employment based on the identified energy consumption EV, in particular for the preceding employment.

In the exemplary embodiment shown, the length L of the object 101 in the form of the hedge is obtained, but not its depth. This would have been able to be predefined by the user during the determination of the employment. However, in a first employment the energy demand EB was obtained based on a works-side basic value, in particular for the depth of the hedge. After the energy consumption EV has been identified for the employment, when the method is next carried out in step b) the energy demand EB for the next, in particular same, employment can be obtained relatively more precisely. In particular, the identified energy consumption EV for the employment can be stored in the memory unit of the determination device 50 and/or the determination device 50 can be configured for this purpose.

In addition, the method comprises the step of outputting, and/or the gardening and/or forestry apparatus system 10 is configured to output, a residual employment, in particular a residual running time, a residual area and/or a residual length. In other words: for how much apparatus running time, for what area and/or for what length can the gardening and/or forestry apparatus 20a, 20b still be used with the accumulator 30', 30'', 30''', or for how much apparatus running time, for what area and/or for what length will the energy content EI of the accumulator still last. In alternative exemplary embodiments, the method can comprise the step of outputting, and/or the gardening and/or forestry apparatus system can be configured to output, a residual employment, in particular a residual number of cuts.

If the accumulator 30''' is removed from the charger 40 for the employment of the gardening and/or forestry apparatus 20a in the form of the hedge pruner or hedge shears, the charger 40 is free to charge one of the accumulators 30', 30'' for the employment of the gardening and/or forestry apparatus 20b in the form of the leaf blower. The method comprises the steps: obtaining a respective period of time T for charging a respective accumulator 30', 30'' according to the method described above. Comparing the periods of time T of the various accumulators 30', 30''. Obtaining and outputting the accumulator 30', 30'' which has the shortest period of time T for charging.

The energy content EI of the accumulator 30'' with the designation of, for example, two crosses is greater here than the energy content EI of the accumulator 30' with the designation of, for example, one cross. As a result, the period of time T for charging the accumulator 30'' is shorter than the period of time T for charging the accumulator 30'. This is output. This permits the user to decide that he would like to charge the accumulator 30'' for the employment of the gardening and/or forestry apparatus 20b in the form of the leaf blower with the charger 40. The period of time T for charging the accumulator 30'' is 30 minutes here.

Furthermore, the method comprises the steps: obtaining total periods of time Tges for charging the various accumulators 30', 30'', 30''' for various accumulator-apparatus pairs based on the periods of time T; comparing the various total periods of time Tges of the various accumulator-apparatus pairs; obtaining and outputting the accumulator-apparatus pair which has the shortest overall period of time Tges for charging. In addition, the shortest total period of time Tges for charging is output. Here, the total period of time Tges is the sum of the periods of time T, in detail 10 minutes+30 minutes=40 minutes.

In the exemplary embodiment shown, the accumulators 30', 30'', 30''' are identical in design. In alternative exemplary embodiments, the accumulators can be of different designs or can or may be charged with different power levels. Furthermore, in the exemplary embodiment shown, the gardening and/or forestry apparatus system 10 has just a single charger 40. In alternative exemplary embodiments, the gardening and/or forestry apparatus system can have more than one charger. One charger can be a standard charger and another charger can be a quick charger. The various accumulators can each be compatible with individual chargers or with a plurality of the chargers. Various accumulator-charger pairs can give rise to different periods of time and/or total periods of time. An optimum pairing can be obtained.

As becomes clear from the exemplary embodiments which are shown and explained above, the invention makes available an advantageous method for obtaining information for operating, in particular for charging, an accumulator, which has improved properties, in particular more functionalities. In particular, the method can permit a user of an electrically powered gardening and/or forestry apparatus to make decisions about the accumulator, the gardening and/or forestry apparatus and/or an employment. Furthermore, the invention is based on a method for obtaining periods of time for charging various accumulators using such a method, and an electric gardening and/or forestry apparatus system with at least one accumulator for carrying out such a method.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for obtaining information for operating an accumulator, wherein the accumulator is configured to supply drive energy to an electrically powered gardening and/or forestry apparatus, the method comprising the steps of:
   a) obtaining an employment of the electrically powered gardening and/or forestry apparatus,
   b) obtaining an energy demand of the gardening and/or forestry apparatus from the obtained employment,
   c) obtaining an energy content of the accumulator,
   d) comparing the obtained energy demand to the obtained energy content, and
   e) obtaining and outputting the information for operating the accumulator based on the comparison,
   wherein step e) comprises:
      obtaining a quantity of energy for charging the accumulator to meet the obtained energy demand, and
      obtaining and outputting the information for operating the accumulator based on the obtained quantity of energy, the information for operating the accumulator including a period of time for charging of the accumulator, and
   further wherein
   the accumulator is configured to supply drive energy to different electrically powered gardening and/or forestry apparatus, and
   the method further comprises the step of:
      obtaining employments of the different electrically powered gardening and/or forestry apparatus and outputting information for operating the accumulator for each of the different obtained employments.

2. The method according to claim 1,
   wherein the employment of the electrically powered gardening and/or forestry apparatus has a surface area, a length and/or a number of cuts of an object to be treated.

3. The method according to claim 2,
wherein step a) comprises:
moving a position determination device for determining position coordinates along the object to be treated and determining position coordinates using the position determination device during the movement, and
obtaining the surface area, the length and/or the number of cuts of the object to be treated based on the determined position coordinates.

4. The method according to claim 1,
wherein in step e) the information is outputted using optics, acoustics and/or haptics.

5. The method according to claim 1, wherein step c) comprises:
measuring an electric property of the accumulator and/or an electric property for charging the accumulator.

6. The method according to claim 1, further comprising the step of:
h) identifying an energy consumption of the electrically powered gardening and/or forestry apparatus for the employment, and
during a next carrying out of the method, in step b) obtaining the energy demand of the gardening and/or forestry apparatus from the obtained employment based on the identified energy consumption.

7. The method according to claim 1, further comprising the steps of:
f) charging the accumulator, and
g) outputting of further information, if the energy content of the accumulator is sufficient to satisfy the energy demand.

8. The method according to claim 1, wherein
the accumulator is an exchangeable accumulator.

9. A method for obtaining periods of time for charging different accumulators, wherein the different accumulators each are configured to supply drive energy to an electrically powered gardening and/or forestry apparatus, the method comprising the steps of:
obtaining, for each of the different accumulators, a respective period of time for charging a respective accumulator by:
a) obtaining an employment of the electrically powered gardening and/or forestry apparatus,
b) obtaining an energy demand of the gardening and/or forestry apparatus from the obtained employment,
c) obtaining an energy content of the accumulator,
d) comparing the obtained energy demand to the obtained energy content, and
e) obtaining and outputting information for charging the accumulator based on the comparison, including:
obtaining a quantity of energy for charging the accumulator to meet the obtained energy demand, and
obtaining and outputting the information for charging the accumulator based on the obtained quantity of energy, the information for charging the accumulator including a period of time for charging of the accumulator;
comparing the respective periods of time of the different accumulators,
obtaining the accumulator having the shortest period of time for charging, and
outputting an identification of the accumulator having the shortest period of time for charging.

10. The method according to claim 9,
wherein the different accumulators each are configured to supply drive energy to different electrically powered gardening and/or forestry apparatus,
the method further comprising the steps of:
obtaining employments of the different electrically powered gardening and/or forestry apparatus,
obtaining a respective period of time for charging a respective accumulator for the employments,
obtaining total periods of time for charging the different accumulators for different accumulator-apparatus pairs based on the periods of time,
comparing the different total periods of time of the different accumulator-apparatus pairs,
obtaining the accumulator-apparatus pair having the shortest total period of time for charging, and
outputting an identification of the obtained accumulator-apparatus pair having the shortest total period of time for charging.

11. An electrical gardening and/or forestry apparatus system, comprising:
at least one electrically powered gardening and/or forestry apparatus, and
at least one accumulator, wherein the accumulator is configured to supply drive energy to the gardening and/or forestry apparatus,
wherein the electrical gardening and/or forestry apparatus system is configured to:
a) obtain an employment of the electrically powered gardening and/or forestry apparatus,
b) obtain an energy demand of the gardening and/or forestry apparatus from the obtained employment,
c) obtain an energy content of the accumulator,
d) compare the obtained energy demand to the obtained energy content, and
e) obtain and output information for operating the accumulator based on the comparison, including being configured to:
obtain a quantity of energy for charging the accumulator to meet the obtained energy demand, and
obtain and output the information for operating the accumulator based on the obtained quantity of energy, the information for operating the accumulator including a period of time for charging of the accumulator, and further wherein
the accumulator is configured to supply drive energy to different electrically powered gardening and/or forestry apparatus, and
wherein the electrical gardening and/or forestry apparatus system is further configured to:
obtain employments of the different electrically powered gardening and/or forestry apparatus and output information for operating the accumulator for each of the different obtained employments.

12. The electrical gardening and/or forestry apparatus system according to claim 11,
wherein the electrical gardening and/or forestry apparatus system includes at least one charger, wherein the charger is configured to charge the at least one accumulator.

13. The electrical gardening and/or forestry apparatus system according to claim 11,
wherein the electrical gardening and/or forestry apparatus system includes a mobile determination device, wherein the mobile determination device is configured to obtain the employment of the at least one electrically powered gardening and/or forestry apparatus, to obtain the energy demand of the gardening and/or forestry apparatus from the obtained employment, to compare the obtained energy demand to the obtained energy content of the at least one accumulator, and to obtain and output the information for operating the accumulator based on the comparison.

14. The electrical gardening and/or forestry apparatus system according to claim 11,
wherein the at least one electrically powered gardening and/or forestry apparatus is one of:
a saw, a pole pruner, a clearing saw or a brush cutter, a hedge pruner or hedge shears, a hedge trimmer, a blower apparatus, a leaf blower, a lopper, a cutoff grinder, a sweeper apparatus, a sweeper roller, a sweeper brush, a lawn mower, a dethatcher and/or a grass trimmer.

15. A method for obtaining periods of time for charging different accumulators, wherein the different accumulators each are configured to supply drive energy to an electrically powered gardening and/or forestry apparatus, the method comprising the steps of:
obtaining, for each of the different accumulators, a respective period of time for charging a respective accumulator by:
a) obtaining an employment of the electrically powered gardening and/or forestry apparatus, wherein the employment of the electrically powered gardening and/or forestry apparatus has a surface area, a length and/or a number of cuts of an object to be treated,
b) obtaining an energy demand of the gardening and/or forestry apparatus from the obtained employment,
c) obtaining an energy content of the accumulator,
d) comparing the obtained energy demand to the obtained energy content, and
e) obtaining and outputting information for charging the accumulator based on the comparison, including:
obtaining a quantity of energy for charging the accumulator to meet the obtained energy demand, and
obtaining and outputting the information for charging the accumulator based on the obtained quantity of energy, the information for charging the accumulator including a period of time for charging of the accumulator;
comparing the respective periods of time of the different accumulators,
obtaining the accumulator having the shortest period of time for charging, and
outputting an identification of the accumulator having the shortest period of time for charging.

\* \* \* \* \*